(12) United States Patent
Yoon et al.

(10) Patent No.: US 12,016,241 B2
(45) Date of Patent: Jun. 18, 2024

(54) QUANTUM DOT DEVICE, METHOD OF MANUFACTURING THE SAME, AND ELECTRONIC DEVICE

(71) Applicant: SAMSUNG ELECTRONICS CO., LTD., Suwon-si (KR)

(72) Inventors: Won Sik Yoon, Seoul (KR); Moon Gyu Han, Suwon-si (KR); Kwanghee Kim, Seoul (KR); Heejae Lee, Seongnam-si (KR); Eun Joo Jang, Suwon-si (KR); Tae Hyung Kim, Seoul (KR); Hyo Sook Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 434 days.

(21) Appl. No.: 17/171,008

(22) Filed: Feb. 9, 2021

(65) Prior Publication Data
US 2021/0257551 A1    Aug. 19, 2021

(30) Foreign Application Priority Data

Feb. 13, 2020 (KR) .................. 10-2020-0017693
Feb. 8, 2021 (KR) .................. 10-2021-0017710

(51) Int. Cl.
*H10K 85/00* (2023.01)
*B82Y 20/00* (2011.01)
(Continued)

(52) U.S. Cl.
CPC .............. *H10K 85/00* (2023.02); *B82Y 20/00* (2013.01); *B82Y 30/00* (2013.01); *B82Y 40/00* (2013.01);
(Continued)

(58) Field of Classification Search
CPC ...... H10K 50/11; H10K 50/115; H10K 50/16; H10K 50/167; H10K 50/171;
(Continued)

(56) References Cited

U.S. PATENT DOCUMENTS 8,969,856 B2 * 3/2015 Liu .................. H10K 50/17
                                           257/E51.001
9,054,330 B2   6/2015 Qian et al.
(Continued)

FOREIGN PATENT DOCUMENTS

KR    1626525 B1    5/2016
KR    1658691 B1    9/2016
(Continued)

OTHER PUBLICATIONS

Extended European Search Report issued in European Patent Application No. 21156163.4., dated Jul. 23, 2021.
(Continued)

*Primary Examiner* — Natalia A Gondarenko
(74) *Attorney, Agent, or Firm* — CANTOR COLBURN LLP

(57) ABSTRACT

A quantum dot device including a first electrode and a second electrode each having a surface opposite the other, a quantum dot layer disposed between the first electrode and the second electrode, an electron transport layer disposed between the quantum dot layer and the second electrode and including first inorganic nanoparticles and a first organic material, and an electron injection layer disposed between the electron transport layer and the second electrode and including second inorganic nanoparticles and a second organic material, wherein a ratio by weight of an amount of the second organic material to a total amount of the second inorganic nanoparticles and the second organic material in the electron injection layer is less than a ratio by weight of
(Continued)

an amount of the first organic material to a total amount of the first inorganic nanoparticles and the first organic material in the electron transport layer. An electronic device including the quantum dot device.

23 Claims, 3 Drawing Sheets

(51) Int. Cl.
| | |
|---|---|
| *B82Y 30/00* | (2011.01) |
| *B82Y 40/00* | (2011.01) |
| *H10K 50/11* | (2023.01) |
| *H10K 50/115* | (2023.01) |
| *H10K 50/16* | (2023.01) |
| *H10K 50/17* | (2023.01) |
| *H10K 71/00* | (2023.01) |
| *H10K 101/40* | (2023.01) |
| *H10K 102/00* | (2023.01) |

(52) U.S. Cl.
CPC ............ *H10K 50/11* (2023.02); *H10K 50/115* (2023.02); *H10K 50/167* (2023.02); *H10K 50/171* (2023.02); *H10K 71/00* (2023.02); *H10K 2101/40* (2023.02); *H10K 2102/331* (2023.02)

(58) Field of Classification Search
CPC ......... H10K 2101/40; H10K 2102/331; H10K 71/00; H10K 85/00; H10K 50/165; H10K 50/17; C09K 11/70; C09K 11/88; B82Y 20/00; B82Y 30/00; B82Y 40/00; H01L 31/0352; H01L 31/035209; H01L 31/035218; H01L 31/0296; H01L 31/0272; H01L 31/03925; H01L 31/02725; H01L 31/147; H01L 31/184; H01L 31/1828; H01L 33/0029; H01L 33/0012; H01L 33/0083; H01L 33/0087; H01L 33/0091; H01L 33/26; H01L 33/28; H01L 33/285
USPC ........................................ 257/40, 13, 33.005
See application file for complete search history.

(56) References Cited

U.S. PATENT DOCUMENTS

| | | | |
|---|---|---|---|
| 9,444,062 B2 | 9/2016 | Becker et al. | |
| 10,396,306 B2 | 8/2019 | Kim et al. | |
| 10,665,805 B2 | 5/2020 | Lee et al. | |
| 2009/0078933 A1* | 3/2009 | Koo | H10K 50/155 257/40 |
| 2012/0292594 A1* | 11/2012 | Zhou | H10K 30/152 977/773 |
| 2019/0067618 A1 | 2/2019 | Xiao | |
| 2019/0131557 A1* | 5/2019 | Lee | H10K 85/1135 |
| 2019/0157596 A1 | 5/2019 | Kim et al. | |

FOREIGN PATENT DOCUMENTS

| | | |
|---|---|---|
| KR | 1020190035399 A | 4/2019 |
| KR | 101980979 B1 | 5/2019 |
| KR | 1020190057733 A | 5/2019 |
| KR | 1020190079111 A | 7/2019 |
| WO | 2012161179 A1 | 11/2012 |

OTHER PUBLICATIONS

Jiangyong Pan, et al., ACS Photonics, vol. 3, No. 2, Feb. 3, 2016, pp. 215-222.
Sheng Cao, et al., Applied Materials & Interfaces, vol. 9, No. 18, May 19, 2017, pp. 15605-15614.
English Abstract of KR 1020190035399.
English Abstract of KR 10-2019-0057733.
English Abstract of KR 1020190079111.
J. M. Caruge, et al., Colloidal quantum-dot light-emitting diodes with metal-oxide charge transport layers, nature photonics | vol. 2 | Apr. 2008 |www.nature.com/naturephotonics 247-250.
Jong-Hoon Kim, et al, Performance Improvement of Quantum Dot-Light-Emitting Diodes Enabled by an Alloyed ZnMgO Nanoparticle Electron Transport Layer, Chem. Mater. 2015, 27, 197-204.
Khan Qasim, et al, Enhanced Electrical Efficiency of Quantum Dot Based LEDs with TiO2 as the Electron Transport Layer Fabricated Under the Optimized Annealing-Time Conditions, Nanoscience and Nanotechnology vol. 12, 7879-7884, 2012.
Lixi Wang, et al., A highly efficient white quantum dot light emitting diode employing magnesium doped zinc oxide as the electron transport layer based on bilayered quantum dot layers, J. Mater. Chem. C, 2018, 6, 8099-8104.
Qin Zhang, et al., vol. 8, No. 4, Apr. 1, 2018, Optical Materials Express 911, revised Mar. 11, 2018; accepted Mar. 11, 2018; published Mar. 15, 2018, 10 pp.
Yizhe Sun, et al., Efficient quantum dot light-emitting diodes with a Zn0.85Mg0.15O interfacial modification layer, The Royal Society of Chemistry 2017, Nanoscale, 8 pp.
Yizhe Sun, et al., SID 2017 Digest, vol. 48, No. 1, pp. 1699-1701.
Yufei Tu,et al., Nanotechnology 29 (2018) 485203 (9pp).

* cited by examiner

US 12,016,241 B2

QUANTUM DOT DEVICE, METHOD OF MANUFACTURING THE SAME, AND ELECTRONIC DEVICE

CROSS-REFERENCE TO RELATED APPLICATION

This application claims priority to Korean Patent Application No. 10-2020-0017693 and 10-2021-0017710 filed in the Korean Intellectual Property Office on Feb. 13, 2020 and Feb. 8, 2021 respectively, and all the benefits accruing therefrom under 35 U.S.C. § 119, the entire content of which is incorporated herein by reference.

BACKGROUND

1. Field

A quantum dot device and an electronic device including the quantum dot device are disclosed.

2. Description of the Related Art

Unlike bulk material, intrinsic physical characteristics (e.g., energy bandgaps, melting points, etc.) of nanoparticles may be controlled by changing the nanoparticle sizes. For example, semiconductor nanocrystal particles also known as quantum dots when supplied with photoenergy or electrical energy may emit light in a wavelength corresponding to sizes of the quantum dots. Accordingly, the quantum dots may be used as a light emitter configured to emit light of a predetermined wavelength.

SUMMARY

Quantum dots used as a light emitter in an electronic device, e.g., a display device, has been the subject of recent research. However, quantum dots are different from a conventional light emitter, and thus a new method of improving performance or lifetime of a quantum dot device is of great interest.

An embodiment is to provide a quantum dot device capable of realizing improved performance.

Another embodiment provides an electronic device including the quantum dot device.

According to an embodiment, a quantum dot device includes a first electrode and a second electrode each having a surface opposite the other, a quantum dot layer between the first electrode and the second electrode, an electron transport layer between the quantum dot layer and the second electrode and including first inorganic nanoparticles and a first organic material, and an electron injection layer between the electron transport layer and the second electrode and including second inorganic nanoparticles and a second organic material, wherein a ratio by weight of an amount of the second organic material to a total amount of the second inorganic nanoparticles and the second organic material in the electron injection layer is less than a ratio by weight of an amount of the first organic material to a total amount of the first inorganic nanoparticles and the first organic material in the electron transport layer.

The ratio by weight of the amount of the second organic material to the total amount of the second inorganic nanoparticles and the second organic material in the electron injection layer may be about 0.01 times to about 0.8 times of the ratio by weight of the amount of the first organic material to a total amount of the first inorganic nanoparticles and the first organic material in the electron transport layer.

An amount of the second organic material in the electron injection layer may be less than or equal to about 25 weight percent (wt %) based on a total amount of the second inorganic nanoparticles and the second organic material.

A LUMO energy level of the electron injection layer may be shallower than a work function of the second electrode and deeper than a LUMO energy level of the electron transport layer.

The first inorganic nanoparticles may be metal oxide nanoparticles represented by $Zn_{1-x}Q_xO$, wherein Q is at least one metal excluding Zn, and $0 \leq x < 0.5$.

The at least one metal Q may include Mg, Co, Ni, Ga, Al, Ca, Zr, W, Li, Ti, Ta, Sn, Hf, Si, Ba, or a combination thereof.

The second inorganic nanoparticles may be metal oxide nanoparticles that are dispersible in a polar dispersion medium such as water, alcohol, or a combination thereof.

The second inorganic nanoparticles may be metal oxide nanoparticles including at least one of Ti, Ce, Sn, Mg, Zr, W, or Al.

The first inorganic nanoparticles may be metal oxide nanoparticles represented by $Zn_{1-x}Q_xO$, wherein Q is at least one metal excluding Zn, and $0 \leq x < 0.5$, and the second inorganic nanoparticles may be different from the first inorganic nanoparticles and may be metal oxide nanoparticles including at least one of Ti, Ce, Sn, Mg, Zr, W, or Al.

The electron injection layer may have a thickness that is less than a thickness of the electron transport layer.

A thickness of the electron injection layer may be less than or equal to about 10 nanometers (nm).

The electron injection layer may be in contact with the second electrode.

According to another embodiment, a quantum dot device includes a first electrode and a second electrode each having a surface opposite the other, a quantum dot layer between the first electrode and the second electrode, and an electron injection layer between the second electrode and the quantum dot layer and including inorganic nanoparticles and an organic material, wherein an amount of the organic material in the electron injection layer is less than or equal to about 25 wt %, based on a total amount of the inorganic nanoparticles and the organic material.

The inorganic nanoparticles in the electron injection layer may be metal oxide nanoparticles including at least one of Ti, Ce, Sn, Mg, Zr, W, or Al.

The quantum dot device may further include an electron transport layer between the quantum dot layer and the electron injection layer, the electron transport layer may include metal oxide nanoparticles represented by $Zn_{1-x}Q_xO$, wherein Q is at least one metal excluding Zn, and $0 \leq x < 0.5$, and the inorganic nanoparticles in the electron injection layer may be metal oxide nanoparticles including at least one of Ti, Ce, Sn, Mg, Zr, W, or Al.

The electron transport layer may further include an organic material, and an amount of the organic material in the electron injection layer may be less than an amount of the organic material in the electron transport layer.

A thickness of the electron injection layer may be less than or equal to about 10 nm.

The electron injection layer may be in contact with the second electrode.

According to another embodiment, a method of manufacturing a quantum dot device includes forming a first electrode, forming a quantum dot layer on the first electrode, forming an electron transport layer including first inorganic nanoparticles on the quantum dot layer, forming an electron injection layer including second inorganic nanoparticles on the electron transport layer, and forming a second electrode on the electron injection layer, wherein the forming the electron injection layer includes preparing a first dispersion including the second inorganic nanoparticles and a first amount of an organic material, removing at least a portion of the organic material from the first dispersion to prepare a second dispersion including a second amount of organic material less than the first amount of organic material, and coating the second dispersion on the electron transport layer.

The method may further include providing a polar dispersion medium such as water, at least one alcohol, or a combination thereof to the second dispersion before the coating of the second dispersion.

An amount of the organic material (excluding the dispersion medium) in the second dispersion may be less than or equal to about 25 wt %, based on a total amount of the second inorganic nanoparticles and the organic material.

According to another embodiment, an electronic device including the quantum dot device is provided.

The characteristics of the quantum dot device may be improved.

DETAILED DESCRIPTION

Figure 1:
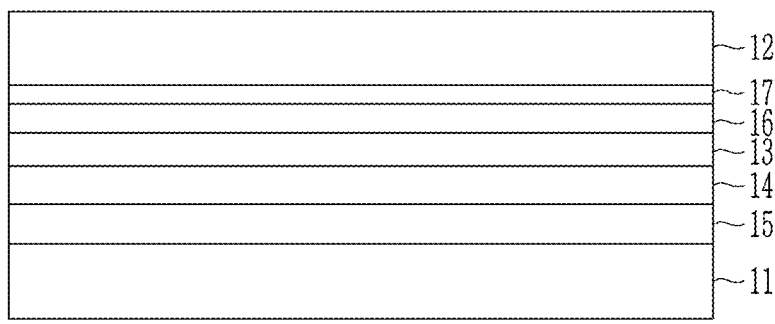
FIG. 1 is a schematic cross-sectional view of a quantum dot device according to an embodiment.

Hereinafter, example embodiments of the present disclosure will be described in detail so that a person skilled in the art would understand the same. This disclosure may, however, be embodied in many different forms and is not construed as limited to the example embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the following descriptions, it will be understood that, although the terms "first", "second", etc., may be used to describe various elements, components, regions, layers, and/or sections, these elements, components, regions, layers, and/or sections, should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness of layers, films, panels, regions, etc., are exaggerated for clarity. Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, the term "combination" includes a mixture and a laminated structure of two or more.

The term "substituted" refers to the replacement of a hydrogen in a compound, for example, a hydrogen on a ring carbon or an amine hydrogen, with deuterium, —F, —Cl, —Br, —I, —SF$_5$, a hydroxyl group, a cyano group, a nitro group, an amidino group, a hydrazine group, a hydrazone group, a carboxylic acid group or salt thereof, a sulfonic acid group or salt thereof, a phosphoric acid group or salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic hetero-condensed polycyclic group.

Hereinafter, a work function, a HOMO energy level, or a LUMO energy level is expressed as an absolute value from a vacuum level. In addition, when the work function, HOMO energy level, or LUMO energy level is said to be "deep," "high," or "large," absolute values are large based on "0 electron Volts (eV)" of the vacuum level, while when the work function, HOMO energy level, or LUMO energy level is said to be "shallow," "low," or "small," absolute values are small based on "0 eV" of the vacuum level.

Hereinafter, the HOMO energy level is obtained by measuring a photoelectric work function of thin films with a thickness of about 20 nm to about nm using the AC-3 equipment (Riken Keiki Co. Ltd.) and by calculating the emission energy due to the photoelectron effect for the irradiated energy by the following relationship equation in the range of about 7.0 eV to about 4 eV.

Relationship Equation $$E = h \cdot c / \lambda$$

(h: planks constant, c: speed of light, and λ: wavelength)

The LUMO energy level may be a value measured by ultraviolet photoelectron spectroscopy (UPS).

The term, 'metal' as used herein may include a metal and a semi-metal.

A quantum dot device according to an embodiment is described with reference to drawings.

FIG. 1 is a schematic cross-sectional view of a quantum dot device according to an embodiment.

Referring to FIG. 1, a quantum dot device 10 according to an embodiment includes a first electrode 11 and a second electrode 12 each having a surface facing the other; a quantum dot layer 13 between the first electrode 11 and the second electrode 12; a hole transport layer 14 and a hole injection layer 15 between the first electrode 11 and the quantum dot layer 13; and an electron transport layer 16 and an electron injection layer 17 between the second electrode 12 and the quantum dot layer 13.

The substrate (not shown) may be disposed under the first electrode 11 or may be disposed on the second electrode 12. The substrate may be, for example, made of an inorganic material such as glass; an organic material such as polycarbonate, polymethylmethacrylate, polyethylene terephthalate, polyethylene naphthalate, polyamide, polyethersulfone, or a combination thereof; or a silicon wafer. The substrate may be omitted.

One of the first electrode 11 and the second electrode 12 is an anode and the other is a cathode. For example, the first electrode 11 may be an anode and the second electrode 12 may be a cathode. For example, the first electrode 11 may be a cathode and the second electrode 12 may be an anode. The anode may include a conductor having a high work function, for example, a metal, a conductive metal oxide, or a combination thereof. The anode may include, for example, a metal such as nickel, platinum, vanadium, chromium, copper, zinc, or gold, or an alloy thereof; a conductive metal oxide such as zinc oxide, indium oxide, tin oxide, indium tin oxide (ITO), indium zinc oxide (IZO), or a fluorine-doped tin oxide; or a combination of metal and oxide such as ZnO and Al or $SnO_2$ and Sb, but is not limited thereto.

The cathode may include a conductor having a lower work function than the anode, and may include, for example, a metal, a conductive metal oxide, and/or a conductive polymer. The cathode may include, for example, a metal such as aluminum, magnesium, calcium, sodium, potassium, titanium, indium, yttrium, lithium, gadolinium silver, tin, lead, cesium, barium, and the like, or an alloy thereof; a multi-layer structure such as LiF/Al, $Li_2O$/Al, Liq/Al, LiF/Ca, and $BaF_2$/Ca, but is not limited thereto.

A work function of the anode may be higher than a work function of the cathode, for example the work function of the anode may be, for example, about 4.5 eV to about 5.0 eV and the work function of the cathode may be about 4.0 eV to about 4.7 eV. Within this range, the work function of the anode may be, for example, about 4.6 eV to about 4.9 eV or about 4.6 eV to about 4.8 eV, and the work function of the cathode may be, for example, about 4.0 eV to about 4.6 eV or about 4.3 eV to about 4.6 eV.

At least one of the first electrode 11 or the second electrode 12 may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 12 is a non-light-transmitting electrode, it may be made of for example an opaque conductor such as aluminum (Al), silver (Ag), or gold (Au).

The quantum dot layer 13 includes quantum dots. The quantum dots may be a semiconductor nanocrystal, and may have various shapes, for example a sphere semiconductor nanocrystal, a quantum rod, or a quantum plate. Herein, the quantum rod may be a quantum dot having an aspect ratio (length:width ratio) of greater than about 1, for example, greater than or equal to about 2, greater than or equal to about 3, or greater than or equal to about 5. For example, the quantum rod may have an aspect ratio of less than or equal to about 50, less than or equal to about 30, or less than or equal to about 20.

The quantum dot may have, for example, an average particle diameter (an average largest particle length for a non-spherical shape) of for example about 1 nm to about 100 nm, about 1 nm to about 80 nm, about 1 nm to about 50 nm, or about 1 nm to 20 nm.

Energy bandgaps of quantum dots may be controlled according to sizes and compositions of the quantum dots, and thus, the light emitting wavelength may be controlled. For example, as the sizes of quantum dots increase, the quantum dots may have narrow energy bandgaps and thus configured to emit light in a relatively long wavelength region while as the sizes of the quantum dots decrease, the quantum dots may have wide energy bandgap and thus configured to emit light in a relatively short wavelength region.

For example, the quantum dot may be configured to emit light in a predetermined wavelength region of a visible ray region according to its size and/or composition. For example, the quantum dot may be configured to emit blue light, red light, or green light, and the blue light may have for example a peak emission wavelength ($\lambda_{max}$) in about 430 nm to about 480 nm, the red light may have for example a peak emission wavelength ($\lambda_{max}$) in about 600 nm to about 650 nm, and the green light may have for example a peak emission wavelength ($\lambda_{max}$) in about 510 nm to about 560 nm.

For example, an average particle size of the quantum dot configured to emit blue light may be, for example, less than or equal to about 4.5 nm, and for example, less than or equal to about 4.3 nm, less than or equal to about 4.2 nm, less than or equal to about 4.1 nm, or less than or equal to about 4.0 nm. Within a range, for example, the average particle size of the quantum dot may be about 2.0 nm to about 4.5 nm, for example, about 2.0 nm to about 4.3 nm, about 2.0 nm to about 4.2 nm, about 2.0 nm to about 4.1 nm, or about 2.0 nm to about 4.0 nm.

The quantum dot may have for example a quantum yield of greater than or equal to about 10%, greater than or equal to about 20%, greater than or equal to about 30%, greater than or equal to about 50%, greater than or equal to about 60%, greater than or equal to about 70% or greater than or equal to about 90%.

The quantum dot may have a relatively narrow full width at half maximum (FWHM). Herein, the FWHM is a width of a wavelength corresponding to a half of a peak absorption point and as the FWHM is narrower, light in a narrower wavelength region may be configured to emit and a higher color purity may be obtained. The quantum dot may have for example a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm. Within the range, it may have for example FWHM of about 2 nm to about 49 nm, about 2 nm to about 48 nm, about 2 nm to about 47 nm, about 2 nm to about 46 nm, about 2 nm to about 45 nm, about 2 nm to about 44 nm, about 2 nm to about 43 nm, about 2 nm to about 42 nm, about 2 nm to about 41 nm, about 2 nm to about 40 nm, about 2 nm to about 39 nm, about 2 nm to about 38 nm, about 2 nm to about 37 nm, about 2 nm to about 36 nm, about 2 nm to about 35 nm, about 2 nm to about 34 nm, about 2 nm to about 33 nm, about 2 nm to about 32 nm, about 2 nm to about 31 nm, about 2 nm to about 30 nm, about 2 nm to about 29 nm, or about 2 nm to about 28 nm.

For example, the quantum dot may include a Group II-VI semiconductor compound, a Group III-V semiconductor compound, a Group IV-VI semiconductor compound, a Group IV semiconductor, a Group I-III-VI semiconductor compound, a Group I-II-IV-VI semiconductor compound, a Group II-III-V semiconductor compound, or a combination thereof. The Group II-VI semiconductor compound may be for example selected from a binary element compound such as CdSe, CdTe, ZnS, ZnSe, ZnTe, ZnO, HgS, HgSe, HgTe, MgSe, MgS, or a mixture thereof; a ternary element compound such as CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; and a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof, but is not limited thereto. The Group III-V semiconductor compound may be for example selected from a binary element compound such as GaN, GaP, GaAs, GaSb, AlN, AlP, AlAs, AlSb, InN, InP, InAs, InSb, or a mixture thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a mixture thereof; and a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof, but is not limited thereto. The Group IV-VI semiconductor compound may be for example selected from a binary element compound such as SnS, SnSe, SnTe, PbS, PbSe, PbTe, or a mixture thereof; a ternary element compound such as SnSeS, SnSeTe, SnSTe, PbSeS, PbSeTe, PbSTe, SnPbS, SnPbSe, SnPbTe, or a mixture thereof; and a quaternary element compound such as SnPbSSe, SnPbSeTe, SnPbSTe, or a mixture thereof, but is not limited thereto. The Group IV semiconductor may be for example selected from a singular element semiconductor such as Si, Ge, or a mixture thereof; and a binary element semiconductor compound such as SiC, SiGe, and a mixture thereof, but is not limited thereto. The Group I-III-VI semiconductor compound may be for example $CuInSe_2$, $CuInS_2$, CuInGaSe, CuInGaS, or a mixture thereof, but is not limited thereto. The Group I-II-IV-VI semiconductor compound may be for example CuZnSnSe, CuZnSnS, or a mixture thereof, but is not limited thereto. The Group II-III-V semiconductor compound may include for example InZnP, but is not limited thereto.

The quantum dot may include the singular element semiconductor, the binary semiconductor compound, the ternary semiconductor compound, or the quaternary semiconductor compound in a substantially uniform concentration or partially different concentration distributions.

For example, the quantum dot may include a cadmium (Cd)-free quantum dot. The cadmium-free quantum dot is a quantum dot that does not include cadmium (Cd). Cadmium (Cd) may cause severe environment/health problems and is a restricted element by Restriction of Hazardous Substances Directive (RoHS) in a plurality of countries, and thus the non-cadmium-based quantum dot may be effectively used.

As an example, the quantum dot may be a semiconductor compound including zinc (Zn), and at least one of tellurium (Te) and selenium (Se). For example, the quantum dot may be a Zn—Te semiconductor compound, a Zn—Se semiconductor compound, and/or a Zn—Te—Se semiconductor compound. For example, an amount of tellurium (Te) in the Zn—Te—Se semiconductor compound may be smaller than an amount of selenium (Se). The semiconductor compound may have a peak emission wavelength ($\lambda_{max}$) in a wavelength region of less than or equal to about 480 nm, for example, about 430 nm to about 480 nm, and may be configured to emit blue light.

For example, the quantum dot may be a semiconductor compound including indium (In) and at least one of zinc (Zn) and phosphorus (P). For example, the quantum dot may be an In—P semiconductor compound and/or an In—Zn—P semiconductor compound. For example, in the In—Zn—P semiconductor compound, a mole ratio of zinc (Zn) to indium (In) may be greater than or equal to about 25. The semiconductor compound may have a peak emission wavelength ($\lambda_{max}$) in a wavelength region of less than about 700 nm, for example about 600 nm to about 650 nm, and may be configured to emit red light.

The quantum dot may have a core-shell structure wherein one quantum dot surrounds another quantum dot. For example, the core and the shell of the quantum dot may have an interface, and an element of at least one of the core or the shell in the interface may have a concentration gradient wherein the concentration of the element(s) of the shell decreases toward the core. For example, a material composition of the shell of the quantum dot has a higher energy bandgap than a material composition of the core of the quantum dot, and thereby the quantum dot may exhibit a quantum confinement effect.

The quantum dot may have one quantum dot core and a multi-layered quantum dot shell surrounding the core. Herein, the multi-layered shell has at least two shells wherein each shell may be a single composition, an alloy, and/or the one having a concentration gradient. For example, a shell of a multi-layered shell that is far from the core may have a higher energy bandgap than a shell that is near to the core, and thereby the quantum dot may exhibit a quantum confinement effect.

The quantum dot having a core-shell structure may for example include a core including a first semiconductor compound including zinc (Zn) and at least one of tellurium (Te) and selenium (Se) and a shell including a second semiconductor compound disposed on at least a portion of the core and having a different composition from that of the core. For example, the first semiconductor compound may be a Zn—Te—Se-based semiconductor compound including zinc (Zn), tellurium (Te), and selenium (Se), for example, a Zn—Se-based semiconductor compound including a small amount of tellurium (Te), for example, a semiconductor compound represented by $ZnTe_xSe_{1-x}$, where x is greater than about 0 and less than or equal to 0.05.

In the Zn—Te—Se-based first semiconductor compound, a mole amount of zinc (Zn) may be higher than that of selenium (Se), and a mole amount of selenium (Se) may be higher than that of tellurium (Te). For example, in the first semiconductor compound, a mole ratio of tellurium (Te) to selenium (Se) may be less than or equal to about 0.05, less than or equal to about 0.049, less than or equal to about 0.048, less than or equal to about 0.047, less than or equal to about 0.045, less than or equal to about 0.044, less than or equal to about 0.043, less than or equal to about 0.042, less than or equal to about 0.041, less than or equal to about 0.04, less than or equal to about 0.039, less than or equal to about 0.035, less than or equal to about 0.03, less than or equal to about 0.029, less than or equal to about 0.025, less than or equal to about 0.024, less than or equal to about 0.023, less than or equal to about 0.022, less than or equal to about 0.021, less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.01. For example, in the first semiconductor compound, a mole ratio of tellurium (Te) to zinc (Zn) may be less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.010.

The second semiconductor compound may include, for example, a Group II-VI semiconductor compound, a Group III-V semiconductor compound, a Group IV-VI semiconductor compound, a Group IV semiconductor, a Group I-III-VI semiconductor compound, a Group I-II-IV-VI semiconductor compound, a Group II-III-V semiconductor compound, or a combination thereof. Examples of the Group II-VI semiconductor compound, Group III-V semiconductor compound, Group IV-VI semiconductor compound, Group IV semiconductor, Group I-III-VI semiconductor compound, Group I-II-IV-VI semiconductor compound, and Group II-III-V semiconductor compound are the same as described above.

For example, the second semiconductor compound may include zinc (Zn), selenium (Se), and/or sulfur (S). For example, the shell may include ZnSeS, ZnSe, ZnS, or a combination thereof. For example, the shell may include at least one inner shell disposed close to the core and an outermost shell disposed at the outermost side of the quantum dot. The inner shell may include ZnSeS, ZnSe, or a combination thereof and the outermost shell may include ZnS. For example, the shell may have a concentration gradient of one component and for example an amount of sulfur (S) may increase as being apart from the core.

A quantum dot having a core-shell structure may include a core including a third semiconductor compound including indium (In) and at least one of zinc (Zn) and phosphorus (P) and a shell disposed on at least a portion of the core and including a fourth semiconductor compound having a composition different from the core. In the In—Zn—P-based third semiconductor compound, a mole ratio of zinc (Zn) to indium (In) may be greater than or equal to about 25. For example, in the In—Zn—P-based third semiconductor compound, the mole ratio of zinc (Zn) to indium (In) may be greater than or equal to about 28, greater than or equal to about 29, or greater than or equal to about 30. For example, in the In—Zn—P-based third semiconductor compound, the mole ratio of zinc (Zn) to indium (In) may be less than or equal to about 55, for example less than or equal to about 50, less than or equal to about 45, less than or equal to about 40, less than or equal to about 35, less than or equal to about 34, less than or equal to about 33, or less than or equal to about 32.

The fourth semiconductor compound may include, for example, a Group II-VI semiconductor compound, a Group III-V semiconductor compound, a Group IV-VI semiconductor compound, a Group IV semiconductor, a Group I-III-VI semiconductor compound, a Group I-II-IV-VI semiconductor compound, a Group II-III-V semiconductor compound, or a combination thereof. Examples of the Group II-VI semiconductor compound, Group III-V semiconductor compound, Group IV-VI semiconductor compound, Group IV semiconductor, Group I-III-VI semiconductor compound, Group I-II-IV-VI semiconductor compound, and Group II-III-V semiconductor compound are the same as described above.

The fourth semiconductor compound may include zinc (Zn) and sulfur (S) and optionally selenium (Se). For example, the shell may include ZnSeS, ZnSe, ZnS, or a combination thereof. The shell may include at least one inner shell disposed close to the core and an outermost shell disposed at the outermost side of the quantum dot. At least one of the inner shell and the outermost shell may include a fourth semiconductor compound of ZnS, ZnSe, or ZnSeS.

The quantum dot layer 13 may have a thickness of, for example, about 5 nm to about 200 nm, within the range, for example, about 10 nm to about 150 nm, for example about 10 nm to about 100 nm, for example about 10 nm to about 50 nm.

The quantum dot layer 13 may have a relatively deep HOMO energy level, for example, a HOMO energy level of greater than or equal to about 5.4 eV, within the range, for example greater than or equal to about 5.5 eV, for example greater than or equal to about 5.6 eV, for example greater than or equal to about 5.7 eV, for example about greater than or equal to about 5.8 eV, for example greater than or equal to about 5.9 eV, for example greater than or equal to about 6.0 eV. Within the range, the HOMO energy level of the quantum dot layer 13 may be for example about 5.4 eV to about 7.0 eV, for example about 5.4 eV to about 6.8 eV, for example, about 5.4 eV to about 6.7 eV, for example, about 5.4 eV to about 6.5 eV, for example, about 5.4 eV to about 6.3 eV, for example, about 5.4 eV to about 6.2 eV, for example, about 5.4 eV to about 6.1 eV, within the range, for example, about 5.5 eV to about 7.0 eV, for example, about 5.5 eV to about 6.8 eV, for example, about 5.5 eV to about 6.7 eV, for example, about 5.5 eV to about 6.5 eV, for example, about 5.5 eV to about 6.3 eV, for example, about 5.5 eV to about 6.2 eV, for example, about 5.5 eV to about 6.1 eV, for example, about 5.5 eV to about 7.0 eV, for example, about 5.6 eV to about 6.8 eV, for example, about 5.6 eV to about 6.7 eV, for example, about 5.6 eV to about 6.5 eV, for example, about 5.6 eV to about 6.3 eV, for example, about 5.6 eV to about 6.2 eV, for example, about 5.6 eV to about 6.1 eV, within the range, for example, about 5.7 eV to about 7.0 eV, for example, about 5.7 eV to about 6.8 eV, for example, about 5.7 eV to about 6.7 eV, for example, about 5.7 eV to about 6.5 eV, for example, about 5.7 eV to about 6.3 eV, for example, about 5.7 eV to about 6.2 eV, for example, about 5.7 eV to about 6.1 eV, within the range, for example, about 5.8 eV to about 7.0 eV, for example, about 5.8 eV to about 6.8 eV, for example, about 5.8 eV to about 6.7 eV, for example, about 5.8 eV to about 6.5 eV, for example, about 5.8 eV to about 6.3 eV, for example, about 5.8 eV to about 6.2 eV, for example, about 5.8 eV to about 6.1 eV, within the range, for example, about 6.0 eV to about 7.0 eV, for example, about 6.0 eV to about 6.8 eV, for example, about 6.0 eV to about 6.7 eV, for example, about 6.0 eV to about 6.5 eV, for example, about 6.0 eV to about 6.3 eV, for example, about 6.0 eV to about 6.2 eV.

The quantum dot layer 13 may have a relatively shallow LUMO energy level, for example, less than or equal to about 3.7 eV, within the range, for example, less than or equal to about 3.6 eV, for example, less than or equal to about 3.5 eV, for example, less than or equal to about 3.4 eV, for example less than or equal to about 3.3 eV, for example, less than or equal to about 3.2 eV, for example, less than or equal to about 3.0 eV. Within the range, the LUMO energy level of the quantum dot layer 13 may be about 2.5 eV to about 3.7 eV, about 2.5 eV to about 3.6 eV, about 2.5 eV to about 3.5 eV, about 2.5 eV to about 3.4 eV, about 2.5 eV to about 3.3 eV, about 2.5 eV to about 3.2 eV, about 2.5 eV to about 3.1 eV, about 2.5 eV to about 3.0 eV, about 2.8 eV to about 3.7 eV, about 2.8 eV to about 3.6 eV, about 2.8 eV to about 3.5 eV, about 2.8 eV to about 3.4 eV, about 2.8 eV to about 3.3 eV, about 2.8 eV to about 3.2 eV, about 3.0 eV to about 3.7 eV, about 3.0 eV to about 3.6 eV, about 3.0 eV to about 3.5 eV, or about 3.0 eV to about 3.4 eV.

The quantum dot layer 13 may have an energy band gap of about 1.7 eV to about 2.3 eV or about 2.4 eV to about 2.9 eV. Within the range, for example, the quantum dot layer 13 may have an energy band gap of about 1.8 eV to about 2.2 eV or about 2.4 eV to about 2.8 eV, within the range, for example, about 1.9 eV to about 2.1 eV, for example, about 2.4 eV to about 2.7 eV.

The hole transport layer 14 and the hole injection layer 15 are disposed between the first electrode 11 and the quantum dot layer 13. The hole transport layer 14 is disposed close to the quantum dot layer 13 between the first electrode 11 and the quantum dot layer 13, and the hole injection layer 15 is disposed close to the first electrode 11 between the first electrode 11 and the quantum dot layer 13. The hole injection layer 15 may facilitate injection of holes from the first electrode 11, and the hole transport layer 15 may effectively transfer the injected holes to the quantum dot layer 13. The hole transport layer 14 and the hole injection layer 15 may have one or two or more layers, respectively, and may include an electron blocking layer in a broad sense.

The hole transport layer 14 and the hole injection layer 15 may each have a HOMO energy level between the work function of the first electrode 11 and the HOMO energy level of the quantum dot layer 13. For example, the work function of the first electrode 11, the HOMO energy level of the hole injection layer 15, the HOMO energy level of the hole transport layer 14, and the HOMO energy level of the quantum dot layer 13 may gradually become deeper, and may be, for example, stepped.

The hole transport layer 14 may have a relatively deep HOMO energy level so as to match the HOMO energy level of the quantum dot layer 13. Accordingly, mobility of holes transferred from the hole transport layer 14 to the quantum dot layer 13 may be improved.

The HOMO energy level of the hole transport layer 14 may be equal to or smaller than the HOMO energy level of the quantum dot layer 13 within a range of about 1.0 eV or less. For example, a difference between the HOMO energy level of the hole transport layer 14 and the quantum dot layer 13 may be about 0 eV to about 1.0 eV, within the range, for example, about 0.01 eV to about 0.8 eV, within the range, for example, about 0.01 eV to about 0.7 eV, within the range, for example, about 0.01 eV to about 0.5 eV, within the range, for example, about 0.01 eV to about 0.4 eV, for example, about 0.01 eV to about 0.3 eV, for example, about 0.01 eV to about 0.2 eV, for example, about 0.01 eV to about 0.1 eV.

The HOMO energy level of the hole transport layer 14 may be, for example, greater than or equal to about 5.0 eV, within the range, for example, greater than or equal to about 5.2 eV, within the range, for example, greater than or equal to about 5.4 eV, within the range, for example, greater than or equal to about 5.6 eV, within the range, for example, greater than or equal to about 5.8 eV.

For example, the HOMO energy level of the hole transport layer 14 may be about 5.0 eV to about 7.0 eV, within the above range, for example, about 5.2 eV to about 6.8 eV, within the above range, for example, about 5.4 eV to about 6.8 eV, for example, about 5.4 eV to about 6.7 eV, for example, about 5.4 eV to about 6.5 eV, for example, about 5.4 eV to about 6.3 eV, for example, about 5.4 eV to about 6.2 eV, for example, about 5.4 eV to about 6.1 eV, for example, about 5.6 eV to about 7.0 eV, for example, about 5.6 eV to about 6.8 eV, for example, about 5.6 eV to about 6.7 eV, for example, about 5.6 eV to about 6.5 eV, for example, about 5.6 eV to about 6.3 eV, for example, about 5.6 eV to about 6.2 eV, for example, about 5.6 eV to about 6.1 eV, for example, about 5.8 eV to about 7.0 eV, for example, about 5.8 eV to about 6.8 eV, for example, about 5.8 eV to about 6.7 eV, for example, about 5.8 eV to about 6.5 eV, for example, about 5.8 eV to about 6.3 eV, for example, about 5.8 eV to about 6.2 eV, for example, about 5.8 eV to about 6.1 eV.

The hole transport layer 14 and the hole injection layer 15 may include a material satisfying the energy level without particular limitation, and may include for example at least one selected from poly(9,9-dioctyl-fluorene-co-N-(4-butylphenyl)-diphenylamine) (TFB), poly(N,N'-bis-4-butylphenyl-N,N'-bisphenyl)benzidine (poly TPD), polyarylamine, poly(N-vinylcarbazole), poly(3,4-ethylenedioxythiophene) (PEDOT), poly(3,4-ethylenedioxythiophene) polystyrene sulfonate (PEDOT: PSS), polyaniline, polypyrrole, N,N,N',N'-tetrakis (4-methoxyphenyl)-benzidine (TPD), 4,4'-bis[N-(1-naphthyl)-N-phenyl-amino]biphenyl (a-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenyl]cyclohexane (TAPC), p-type metal oxide (e.g., NiO, $WO_3$, $MoO_3$, etc.), a carbon-based material such as graphene oxide, and a combination thereof, but are not limited thereto.

One or both of the hole transport layer 14 and the hole injection layer 15 may be omitted.

The electron transport layer 16 and the electron injection layer 17 are disposed between the second electrode 12 and the quantum dot layer 13. The electron transport layer 16 is disposed close to the quantum dot layer 13 between the second electrode 12 and the quantum dot layer 13, and the electron injection layer 17 is disposed close to the second electrode 12 between the second electrode 12 and the quantum dot layer 13. The electron injection layer 17 may facilitate injection of electrons from the second electrode 12, and the electron transport layer 16 may effectively transfer the injected electrons to the quantum dot layer 13. The electron transport layer 16 and the electron injection layer 17 may have one or two or more layers, respectively, and may include a hole blocking layer in a broad sense.

For example, the electron injection layer 17 may be in contact with the second electrode 12.

For example, the electron transport layer 16 may be in contact with the quantum dot layer 13.

For example, the electron transport layer 16 and the electron injection layer 17 may be in contact with each other.

For example, the LUMO energy levels of the second electrode 12, the electron injection layer 17, the electron transport layer 16, and the quantum dot layer 13 may be gradually shallowed. For example, the LUMO energy level of the electron injection layer 17 may be shallower than the work function of the second electrode 12, and the LUMO energy level of the electron transport layer 16 may be shallower than the LUMO energy level of the electron injection layer 17, and the LUMO energy level of the quantum dot layer 13 may be shallower than the LUMO energy level of the electron transport layer 16. That is, the work function of the second electrode 12, the LUMO energy level of the electron injection layer 17, the LUMO energy level of the electron transport layer 16, and the LUMO energy level of the quantum dot layer 13 may have a cascading energy level which gradually decreases in one direction.

The electron transport layer 16 may include first inorganic nanoparticles. The first inorganic nanoparticles may be, for example, oxide nanoparticles, and may be, for example, metal oxide nanoparticles.

The first inorganic nanoparticles may be two-dimensional or three-dimensional nanoparticles with an average particle diameter of less than or equal to about 10 nm, within the range, less than or equal to about 8 nm, less than or equal to about 7 nm, less than or equal to about 5 nm, less than or equal to about 4 nm, or less than or equal to about 3.5 nm, or within the range, about 1 nm to about 10 nm, about 1 nm to about 9 nm, about 1 nm to about 8 nm, about 1 nm to about 7 nm, about 1 nm to about 5 nm, about 1 nm to about 4 nm, or about 1 nm to about 3.5 nm.

The first inorganic nanoparticles may be a metal oxide nanoparticle including at least one metal of zinc (Zn), magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), or barium (Ba).

As an example, the first inorganic nanoparticles may include metal oxide nanoparticles including zinc (Zn), and may include metal oxide nanoparticles represented by $Zn_{1-x}Q_xO$ ($0 \le x < 0.5$). Herein, Q is at least one metal other than Zn, for example magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), silicon (Si), barium (Ba), or a combination thereof. For example, Q may include magnesium (Mg).

For example, x may be in the range, $0.01 \le x \le 0.3$, for example, $0.01 \le x \le 0.2$.

For example, the electron transport layer 16 may include first inorganic nanoparticles and/or aggregates thereof.

The electron transport layer 16 may further include an organic material. The organic material may be a material included in the synthesis step of the first inorganic nanoparticles or may be a material additionally supplied to the dispersion including the first inorganic nanoparticles. For example, the material included in the synthesis step of the first inorganic nanoparticles may be an organic counteranion of a salt included as a precursor of the first inorganic nanoparticles. For example, the organic material additionally supplied to the dispersion including the first inorganic nanoparticles may be a dispersing agent to prevent aggregation of the first inorganic nanoparticles, for example, or an auxiliary agent to control electrical characteristics of the electron transport layer 16.

The organic material may be derived from, for example, acetate; carbonyl; carboxylate; acetyl acetonate; an organic amine, or a combination thereof, but is not limited thereto. Herein, the organic amine may include, for example, a substituted or unsubstituted C1 to C10 alkyl group, a substituted or unsubstituted C6 to C20 aryl group, or a combination thereof, and may include, for example, trimethylamine, triethylamine, tripropylamine, tributylamine, or a combination thereof, but is not limited thereto.

The organic material in the electron transport layer 16 may be disposed on the surface of the first inorganic nanoparticles and/or between adjacent first inorganic nanoparticles to prevent or minimize aggregation of the first inorganic nanoparticles. Accordingly, it is possible to improve dispersibility of the first inorganic nanoparticles by effectively preventing aggregation of the first inorganic nanoparticles in the dispersion for the electron transport layer including the first inorganic nanoparticles.

The organic material in the electron transport layer 16 may be in an amount of greater than or equal to about 20 weight percent (wt %), for example greater than or equal to about 23 wt %, greater than or equal to about 25 wt %, greater than or equal to about 26 wt %, greater than or equal to about 27 wt %, greater than or equal to about 28 wt %, greater than or equal to about 30 wt %, greater than or equal to about 32 wt %, greater than or equal to about 35 wt %, greater than or equal to about 38 wt %, greater than or equal to about 40 wt %, greater than or equal to about 42 wt %, or greater than or equal to about 45 wt %, based on a total amount of the first inorganic nanoparticles and the organic material (excluding a dispersion medium) in the electron transport layer 16. Within the range, the organic material in the electron transport layer 16 may be in an amount of about 20 wt % to about 70 wt %, about 23 wt % to about 70 wt %, about 25 wt % to about 70 wt %, about 26 wt % to about 70 wt %, about 27 wt % to about 70 wt %, about 28 wt % to about 70 wt %, about 30 wt % to about 70 wt %, about 32 wt % to about 70 wt %, about 35 wt % to about 70 wt %, about 38 wt % to about 70 wt %, about 40 wt % to about 70 wt %, about 42 wt % to about 70 wt %, about 45 wt % to about 70 wt %, about 20 wt % to about 60 wt %, about 23 wt % to about 60 wt %, about 25 wt % to about 60 wt %, about 26 wt % to about 60 wt %, about 27 wt % to about 60 wt %, about 28 wt % to about 60 wt %, about 30 wt % to about 60 wt %, about 32 wt % to about 60 wt %, about 35 wt % to about 60 wt %, about 38 wt % to about 60 wt %, about 40 wt % to about 60 wt %, about 42 wt % to about 60 wt % or about 45 wt % to about 60 wt %, about 20 wt % to about 50 wt %, about 23 wt % to about 50 wt %, about 25 wt % to about 50 wt %, about 26 wt % to about 50 wt %, about 27 wt % to about 50 wt %, about 28 wt % to about 50 wt %, about 30 wt % to about 50 wt %, about 32 wt % to about 50 wt %, about 35 wt % to about 50 wt %, about 38 wt % to about 50 wt %, or about 40 wt % to about 50 wt %.

By including the organic material within the above ranges in the electron transport layer 16, aggregation of the first inorganic nanoparticles may be minimized, or effectively prevented from aggregation, in the first inorganic nanoparticle dispersion including the first inorganic nanoparticles, thereby effectively improving dispersibility of the first inorganic nanoparticles and ultimately improving coatability, morphology, and electrical properties of the electron transport layer 16.

The LUMO energy level of the electron transport layer 16 may be a value between the LUMO energy level of the quantum dot layer 13 and the LUMO energy level of the electron injection layer 17 to be described later, and may be about 3.2 eV to about 4.8 eV, about 3.2 eV to about 4.6 eV, about 3.2 eV to about 4.5 eV, about 3.2 eV to about 4.3 eV, about 3.2 eV to about 4.1 eV, about 3.4 eV to 4.1 eV, about 3.5 eV to about 4.6 eV, about 3.6 eV to about 4.6 eV, about 3.6 eV to about 4.3 eV, about 3.6 eV to about 4.1 eV, about 3.6 eV to about 3.9 eV, about 3.7 eV to about 4.6 eV, about 3.7 eV to about 4.3 eV, about 3.7 eV to about 4.1 eV, or about 3.7 eV to about 3.9 eV.

A thickness of the electron transport layer 16 may be greater than about nm and less than or equal to about 80 nm, and within the range, greater than about 10 nm and less than or equal to about 70 nm, greater than about 10 nm and less than or equal to about 60 nm, greater than about 10 nm and less than or equal to about 50 nm, greater than about 10 nm and less than or equal to about 40 nm, or greater than about 10 nm and less than or equal to about 30 nm.

The electron injection layer 17 may include second inorganic nanoparticles different from the first inorganic nanoparticles. The second inorganic nanoparticles may be, for example, oxide nanoparticles, and may be, for example, metal oxide nanoparticles. The second inorganic nanoparticle may be selected in consideration of a relationship between the LUMO energy level of the electron transport layer 16 and the electron injection layer 17. The second inorganic nanoparticles may be selected so that the LUMO energy level of the electron injection layer 17 including the second inorganic nanoparticles is deeper than the LUMO energy level of the electron transport layer 16 including the aforementioned first inorganic nanoparticles.

The second inorganic nanoparticles may be two-dimensional or three-dimensional nanoparticles with an average particle diameter of less than or equal to about 10 nm, within the range, less than or equal to about 9 nm, less than or equal to about 8 nm, less than or equal to about 7 nm, less than or equal to about 5 nm, less than or equal to about 4 nm, or less than or equal to about 3.5 nm, or within the range, about 1 nm to about 10 nm, about 1 nm to about 9 nm, about 1 nm to about 8 nm, about 1 nm to about 7 nm, about 1 nm to about 5 nm, about 1 nm to about 4 nm, or about 1 nm to about 3.5 nm. For example, the second inorganic nanoparticles may be hydrophilic metal oxide nanoparticles dispersible in a polar dispersion medium, wherein the polar dispersion medium may be for example water; alcohols such as methanol, ethanol, propanol, and butanol; or a combination thereof. The second inorganic nanoparticles may have a higher dispersibility in the dispersion medium than the first inorganic nanoparticles, and such high dispersibility may be caused by interactions such as binding energy, van der Waals energy, and repulsion forces between the second inorganic nanoparticles, but the present disclosure is not limited thereto.

The second inorganic nanoparticles may be selected from materials having a higher dispersibility in the dispersion medium than the first inorganic nanoparticles and may be, for example, metal oxide nanoparticle including at least one metal of titanium (Ti), cerium (Ce), tin (Sn), magnesium (Mg), zirconium (Zr), tungsten (W), or aluminum (Al). The second inorganic nanoparticles may be for example $TiO_2$, $CeO_2$, $SnO_2$, $MgO$, $ZrO_2$, $WO_3$, $Al_2O_3$, or a combination thereof, but are not limited thereto.

The electron injection layer 17 may further include an organic material. The organic material in the electron injection layer 17 may be the same as or different from the organic material in the electron transport layer 16. The organic material may be, for example, a material included in the synthesis step of the second inorganic nanoparticles, and may be derived from an organic counteranion of a salt included as a precursor of the second inorganic nanoparticle, such as acetate, carbonyl, carboxylate, acetyl acetonate, organic amine (or organic amine salt), or a combination thereof, but is not limited thereto. Herein, the organic amine may include, for example, a substituted or unsubstituted C1 to C10 alkyl group, a substituted or unsubstituted C6 to C20 aryl group, or a combination thereof, and may include, for example, trimethylamine, triethylamine, tripropylamine, tributylamine, or a combination thereof, but is not limited thereto.

The organic material in the electron injection layer 17 may be controlled to a predetermined amount. While the organic material in the electron injection layer 17 may exhibit an effect of preventing or minimizing aggregation of the second inorganic nanoparticles on the surface of the second inorganic nanoparticles and/or between adjacent second inorganic nanoparticles, an excessive amount of organic material in the electron injection layer 17 may interfere with the injection of electrons from the second electrode 12, thereby increasing a driving voltage of the quantum dot device 10 and reducing the life-span of the quantum dot device 10.

For example, in the step of preparing a dispersion of the second inorganic nanoparticles including the second inorganic nanoparticles, the amount of the organic material may be reduced by removing at least a portion of the organic material. The removing of the organic material may include, for example, centrifugation, precipitation using a solvent and/or dispersion medium, redistribution, and/or washing, but is not limited thereto. In this manner, the electron injection layer 17 may include less organic material than the electron transport layer 16 by including an organic material having a controlled amount. For example, a ratio by weight of an amount of the organic material to a total amount of the second inorganic nanoparticles and the organic material in the electron injection layer 17 may be lower than a ratio by weight of an amount of the organic material to a total amount of the first inorganic nanoparticles and the organic material in the electron transport layer 16. For example, the ratio by weight of the amount of the organic material to a total amount of the second inorganic nanoparticles and the second organic material in the electron injection layer 17 may be about 0.01 times to about 0.9 times, about 0.01 times to about 0.8 times, about 0.01 times to about 0.7 times, or about 0.01 times to about 0.5 times of the ratio by weight of the amount of the organic material to a total amount of the first inorganic nanoparticles and the first organic material in the electron transport layer 16, but is not limited thereto.

As described above, the second inorganic nanoparticles in the electron injection layer 17 may have a higher dispersibility in the dispersion medium than the first inorganic nanoparticles in the electron transport layer 16, and thus even when the organic material in the electron injection layer 17 has a controlled amount, excessive aggregation of the second inorganic nanoparticles may be minimized or, at times, prevented. In addition, as will be described later, since the electron injection layer 17 has a thickness of less than or equal to about 10 nm, even if the electron injection layer has a controlled amount of the organic material, the effect on coatability, morphology, and electrical characteristics of the electron injection layer 17 may become negligible.

The amount of the organic material in the electron injection layer 17 may be controlled to a range capable of preventing or minimizing aggregation of the second inorganic nanoparticles and at the same time effectively improving the injection of electrons from the second electrode 12. For example, the amount of the organic material in the electron injection layer 17 may be controlled to be less than or equal to about 25 wt % based on a total amount of the second inorganic nanoparticles and the organic material. Within the range, the amount of the organic material in the electron injection layer 17 may be controlled to be less than or equal to about 23 wt %, less than or equal to about 22 wt %, less than or equal to about 20 wt %, less than or equal to about 18 wt %, less than or equal to about 15 wt %, less than or equal to about 12 wt %, less than or equal to about 10 wt %, less than or equal to about 9 wt %, less than or equal to about 8 wt %, less than or equal to about 7 wt %, less than or equal to about 6 wt %, less than or equal to about 5 wt %, less than or equal to about 4 wt %, less than or equal to about 3 wt %, or less than or equal to about 2 wt % based on a total amount of the second inorganic nanoparticles and the organic material. Within the range, it may be controlled to be about 1 wt % to about 25 wt %, about 1 wt % to about 23 wt %, about 1 wt % to about 22 wt %, about 1 wt % to about 20 wt %, about 1 wt % to about 18 wt %, about 1 wt % to about 15 wt %, about 1 wt % to about 12 wt %, about 1 wt % to about 10 wt %, about 1 wt % to about 9 wt %, about 1 wt % to about 8 wt %, about 1 wt % to about 7 wt %, about 1 wt % to about 6 wt %, about 1 wt % to about 5 wt %, about 1 wt % to about 4 wt %, about 1 wt % to about 3 wt %, or about 1 wt % to about 2 wt %.

A LUMO energy level of the electron injection layer 17 may be between the work function of the second electrode 12 and the LUMO energy level of the electron transport layer 16. For example, a difference between the work function of the second electrode 12 and the LUMO energy level of the electron injection layer 17 may be less than about 0.5 eV, about 0.001 eV to about 0.5 eV, about 0.001 eV to about 0.4 eV, or about 0.001 eV to about 0.3 eV. As an example, a difference between the LUMO energy level of the electron injection layer 17 and the LUMO energy level of the electron transport layer 16 may be less than about 0.5 eV, about 0.001 eV to about 0.5 eV, about 0.001 eV to about 0.4 eV, or about 0.001 eV to about 0.3 eV. Accordingly, electrons from the second electrode 12 into the electron injection layer 17 may be easily injected to lower a driving voltage of the quantum dot device 10, and electrons from the electron injection layer 17 to the electron transport layer 16 may be effectively transferred to increase efficiency. The LUMO energy level of the electron injection layer 17 may be, about 3.4 eV to about 4.8 eV, about 3.4 eV to about 4.6 eV, about 3.4 eV to about 4.5 eV, about 3.6 eV to about 4.8 eV, about 3.6 eV to about 4.6 eV, about 3.6 eV to about 4.5 eV, about 3.6 eV to about 4.3 eV, about 3.9 eV to about 4.8 eV, about 3.9 eV to about 4.6 eV, about 3.9 eV to about 4.5 eV, or about 3.9 eV to about 4.3 eV within the range satisfying the aforementioned energy level.

The electron injection layer 17 may have a thickness that is less than the thickness of the electron transport layer 16. For example, a thickness of the electron injection layer 17 may be about 0.01 times to about 0.8 times, about 0.01 times to about 0.7 times, about 0.01 times to about 0.5 times, about 0.1 times to about 0.8 times, about 0.1 times to about 0.7 times, or about 0.1 times to about 0.5 times of the thickness of the electron transport layer 16. The thickness of the electron injection layer 17 may be, for example, less than or equal to about 10 nm, less than or equal to about 7 nm, or less than or equal to about 5 nm. Within the range, the thickness of the electron injection layer 17 may be about 1 nm to about 10 nm, about 1 nm to about 8 nm, about 1 nm to about 7 nm, or about 1 nm to about 5 nm.

The quantum dot device 10 includes an electron injection layer 17 including an organic material of a controlled amount between the second electrode 12 and the electron transport layer 16, and thereby the electron injection may be effectively facilitated, and the injected electrons may be effectively transferred to the quantum dot layer 13 through the electron transport layer 16. Therefore, it is possible to effectively lower a driving voltage of the quantum dot device 10, thereby improving luminance and life-span.

For example, the driving voltage (@5 mA) of the quantum dot device 10 may be less than or equal to about 3.0 Volts (V), and within the range, less than or equal to about 2.9 V, less than or equal to about 2.8 eV, less than or equal to about 2.7 eV, less than or equal to about 2.6 eV, or less than or equal to about 2.5 eV. As an example, the driving voltage (@5 mA) of the quantum dot device 10 may be lower than that of the quantum dot device that does not include the aforementioned electron injection layer 17, by about 0.1 eV to about 1.0 eV, within the above range, about 0.2 eV to about 0.9 eV, or about 0.3 eV to about 0.8 eV.

The luminance characteristics of the quantum dot device 10 may be improved compared with the quantum dot device that does not include the aforementioned electron injection layer 17, by about 1.05 times to about 3 times, and within the range, about 1.1 times to about 3 times, or about 1.1 times to about 2.5 times. As an example, the life-span characteristics (T95 or T80) of the quantum dot device 10 may be improved compared with the quantum dot device that does not include the aforementioned electron injection layer 17, by about 1.5 times to about 20 times, and within the range, about 2 times to about 18 times, or about 3 times to about 15 times.

For example, a method of manufacturing a quantum dot device 10 may include forming a first electrode 11 on a substrate (not shown), forming a hole injection layer 15, forming a hole transport layer 14, forming a quantum dot layer 13, forming an electron transport layer 16, forming an electron injection layer 17, and forming a second electrode 12. One or both of the forming of the hole injection layer 15 or the forming of the hole transport layer 14 may be omitted.

The quantum dot layer 13, the hole transport layer 14, the hole injection layer 15, the electron transport layer 16, and/or the electron injection layer 17 may be formed by a solution process, such as spin coating, slit coating, inkjet printing, nozzle printing, spraying, and/or doctor blade coating, but is not limited thereto.

In at least some of the aforementioned steps the method of manufacturing a quantum dot device 10, the forming of the quantum dot layer 13, the forming of the hole transport layer 14, the forming of the hole injection layer 15, the forming of the electron transport layer 16, and/or the forming of the electron injection layer 17, may optionally include drying after the solution process and/or heat-treating may be further performed, and the heat-treating may be, for example, performed at about 50° C. to about 300° C. for about 1 minute to about 10 hours, but is not limited thereto.

For example, the forming of the electron transport layer 16 may include coating first inorganic nanoparticle dispersion including the first inorganic nanoparticles, and optionally drying and/or heat-treating. The first inorganic nanoparticles may be obtained by a sol-gel synthesis method using a metal salt, but is not limited thereto. The dispersion medium may be water; alcohols such as methanol, ethanol, propanol, or butanol; or a combination thereof, but is not limited thereto. The forming the electron transport layer 16 may include centrifugation and/or washing.

For example, the forming of the electron injection layer 17 may include coating second inorganic nanoparticle dispersion including second inorganic nanoparticles, and optionally drying and/or heat-treating. The second inorganic nanoparticles may be obtained by a sol-gel synthesis method using a metal salt, but is not limited thereto. The dispersion medium may be water; alcohols such as methanol, ethanol, propanol, or butanol; or a combination thereof, but is not limited thereto.

The forming of the electron injection layer 17 may further include removing at least some of the excess organic material from the dispersion in order to control the amount of the organic material as described above. For example, the forming of the electron injection layer 17 may include preparing a first dispersion including second inorganic nanoparticles and a first amount of organic material, that is, having an excess amount of organic material, followed by removing at least a portion of the organic material from the first dispersion to prepare a second dispersion including an organic material having a second amount of organic material that is less than the first amount, and coating the second dispersion on the electron transport layer 16.

The removing of at least a portion of the organic material from the first dispersion may include further performing centrifugation one or more times (e.g., 1 to 10 times, 2 to 10 times, or 3 to 8 times), or further performing precipitation, redispersion, and/or washing one or more times (e.g., 1 to 10 times, 2 to 10 times, or 3 to 8 times) using a polar dispersion medium such as water; alcohols such as methanol, ethanol, propanol, and butanol; a combination of at least one alcohol and water, or a combination of at least one alcohol, and/or a non-polar dispersion medium such as hexane, cyclohexane, benzene, toluene, chloroform, diethyl ether, acetone, etc., or a combination thereof, but is not limited thereto.

The amount (second amount) of the organic material in the second dispersion may be less than or equal to about 80 wt %, less than or equal to about 70 wt %, less than or equal to about 50 wt %, less than or equal to about 40 wt %, less than or equal to about 30 wt %, or less than or equal to about 20 wt %, within the range, about 3 wt % to about 80 wt %, about 3 wt % to about 70 wt %, about 3 wt % to about 50 wt %, about 3 wt % to about 40 wt %, about 3 wt % to about 30 wt %, or about 3 wt % to about 20 wt % of the amount (first amount) of the organic material in the first dispersion.

For example, as described above, the amount (the second amount) of organic material in the second dispersion may be controlled to be less than or equal to about 25 wt % based on a total amount of the second inorganic nanoparticles and the organic material (excluding the dispersion medium). Within the range, the amount (the second amount) of organic material may be controlled to be less than or equal to about 23 wt %, less than or equal to about 22 wt %, less than or equal to about 20 wt %, less than or equal to about 18 wt %, less than or equal to about 15 wt %, less than or equal to about 12 wt %, less than or equal to about 10 wt %, less than or equal to about 9 wt %, less than or equal to about 8 wt %, less than or equal to about 7 wt %, less than or equal to about 6 wt %, less than or equal to about 5 wt %, less than or equal to about 4 wt %, less than or equal to about 3 wt %, or less than or equal to about 2 wt %, within the range; about 1 wt % to about 23 wt %, about 1 wt % to about 22 wt %, about 1 wt % to about 20 wt %, about 1 wt % to about 18 wt %, about 1 wt % to about 15 wt %, about 1 wt % to about 12 wt %, about 1 wt % to about 10 wt %, about 1 wt % to about 9 wt %, about 1 wt % to about 8 wt %, about 1 wt % to about 7 wt %, about 1 wt % to about 6 wt %, about 1 wt % to about 5 wt %, about 1 wt % to about 4 wt %, about 1 wt % to about 3 wt %, or about 1 wt % to about 2 wt %.

For example, the method may further include diluting the second dispersion before the coating of the second dispersion. The diluting of the second dispersion may further include, for example, further supplying a polar dispersion medium selected from water, at least one alcohol, or a combination thereof to the second dispersion. For example, the step of dilution with the polar dispersion medium may including the addition of about 2 times to about 10 times, about 2 times to about 7 times, or about 2 times to about 5 times of the total volume of the second dispersion.

The aforementioned quantum dot device may be applied to various electronic devices requiring light emission, and may be applied to various electronic devices, for example, a display device such as a TV, a monitor, a computer, and a mobile device, or a lighting device such as a light source.

Hereinafter, the embodiments are illustrated in more detail with reference to examples. However, the following examples are for illustrative purposes and do not limit the scope of the rights.

Synthesis Example I: Synthesis of Quantum Dot Dispersion

Synthesis Example 1

(1) Synthesis of ZnTeSe Core Quantum Dot Dispersion

Selenium (Se) and tellurium (Te) are respectively dispersed in trioctylphosphine (TOP) to obtain a 2 Molar (M) Se/TOP stock solution and a 0.1 M Te/TOP stock solution.

0.125 millimoles (mmol) of zinc acetate is combined with 0.25 mmol of oleic acid, 0.25 mmol of hexadecylamine, and 10 milliliters (mL) of trioctylamine in a reactor, and then heated under vacuum at 120° C. After 1 hour, nitrogen gas is added to the reactor.

Under nitrogen atmosphere, the reactor is heated at 240° C., and the Se/TOP stock solution and the Te/TOP stock solution in a Te/Se mole ratio of 1/25 are rapidly injected into the reactor. The reaction solution is heated to 300° C., maintained for 30 minutes, and then, rapidly cooled down to room temperature. Acetone is added to the cooled reactor, and the resulting precipitate is separated by centrifugation, and then dispersed in toluene to obtain ZnTeSe core quantum dot dispersion in toluene.

(2) Synthesis of ZnTeSe Core/ZnSeS Shell Quantum Dot Dispersion

To a 10 mL reaction flask containing trioctylamine 0.6 mmol of zinc acetate and 1.2 mmol of oleic acid are added, and the reaction flask is heated at 120° C. under vacuum for 10 minutes. Nitrogen gas is added to the reaction flask. The ZnTeSe core quantum dot dispersion in toluene is rapidly injected into the reaction flask. The 2 M Se/TOP and the 1 M S/TOP in a Se:S mole ratio of 1.2:2.8 are injected into the reaction flask, and the flask is heated to 340° C. When the reaction is complete, the reactor is cooled down to ambient temperature and ethanol is added to the flask, and the resulting nanocrystals are separated by centrifugation and dispersed in toluene to obtain ZnTeSe core/ZnSeS shell quantum dot dispersion in toluene.

Synthesis Example 2

(1) Synthesis of InP Core Quantum Dot Dispersion

In a 200 mL reaction flask including 1-octadecene, indium acetate and palmitic acid are added, and the flask is heated at 120° C. under vacuum. The indium and palmitic acid are added as a mole ratio of 1:3. After 1 hour, nitrogen gas is added to the reaction flask, and the flask is heated to 280° C. A mixed solution of tris(trimethylsilyl)phosphine (TMS$_3$P) and trioctylphosphine is rapidly injected into the reaction flask, and the reaction mixture is maintained at 280° C. for 20 minutes. The TMS$_3$P is used in an amount of 0.5 mols of TMS$_3$P per 1.0 mole of indium. The reaction flask is cooled to room temperature and acetone is added to the flask, and the resulting precipitate is separated by centrifugation and dispersed in toluene to prepare InP core quantum dot dispersion in toluene. The InP core quantum dot has an average particle diameter of about 3 nanometers (nm).

(2) Synthesis of InP Core/ZnSe Shell/ZnS Shell Quantum Dot Dispersion

Selenium (Se) is dispersed in trioctylphosphine (TOP) to prepare a Se/TOP stock solution, and sulfur (S) is dispersed in trioctylphosphine (TOP) to prepare a S/TOP stock solution.

To a 200 mL reaction flask including trioctylamine, zinc acetate and oleic acid are added, and the reaction flask is heated at 120° C. under vacuum for 10 minutes. Nitrogen gas is added to the reaction flask, the flask is heated to 180° C., and the InP core quantum dot dispersion is added to the reaction flask.

The reaction flask is heated to 280° C., a portion of the Se/TOP is injected into the flask, and the mixture is allowed to react at 280° C. The reaction flask is then heated to 320° C., the remainder of Se/TOP is injected into the flask, and the reaction mixture allowed to react for predetermined time to form a ZnSe shell on the InP core. Subsequently, the S/TOP stock solution is added to the reaction mixture, and the mixture is allowed to react for predetermined time to form a ZnS shell on the ZnSe shell to obtain an InP core/ZnSe shell/ZnS shell quantum dot. The ZnSe shell is formed for total reaction time of 60 minutes, and a total amount of Se is about 20 moles based on 1 mole of indium, and the ZnS shell is also formed for total reaction time of 60 minutes, and a total amount of S is about 10 moles based on 1 mole of indium.

The obtained InP core/ZnSe shell/ZnS shell quantum dot is added to an excessive amount of ethanol, and then resulting quantum dot is separated by centrifugation. Following separation, the quantum dot is dried and dispersed in chloroform or toluene to obtain InP core/ZnSe shell/ZnS shell quantum dot dispersion.

Synthesis Example II: Synthesis of First Inorganic Nanoparticles

Synthesis Example 3

8.07 mmol of zinc acetate dihydrate, 0.93 mmol of magnesium acetate tetrahydrate, and 90 mL of dimethylsulfoxide are added to a reactor, and the reactor is heated at 60° C. under air atmosphere. Subsequently, 15 mmol of tetramethylammonium hydroxide pentahydrate is dissolved in 30 mL of ethanol, and then 3 mL of the solution is added to the reactor in a dropwise fashion. After stirring the mixture for 1 hour, the obtained $Zn_{0.85}Mg_{0.15}O$ nanoparticles and the ethyl acetate formed in-situ (in a volume ratio of about 1:9) are separated by centrifugation and dispersed in ethanol to obtain a $Zn_{0.85}Mg_{0.15}O$ nanoparticle dispersion.

The $Zn_{0.85}Mg_{0.15}O$ nanoparticles have an average particle diameter of about 3.0 nm. The average particle diameter of the $Zn_{0.85}Mg_{0.15}O$ nanoparticles is measured by using an UT F30 Tecnai electron microscope.

If the $Zn_{0.85}Mg_{0.15}O$ nanoparticle (ethyl acetate) dispersion is additionally washed with ethanol and redispersed to further reduce an amount of an organic material, i.e., the ethyl acetate, the $Zn_{0.85}Mg_{0.15}O$ nanoparticles become severely aggregated, and exhibit severe deteriorating dispersibility.

Synthesis Example III: Synthesis of Second Inorganic Nanoparticles

Synthesis Example 4

Titanium oxide ($TiO_2$) nanoparticles (anatase, PlasmaChem) are dispersed in water at a concentration of 20 weight percent (wt %) to prepare a titanium oxide nanoparticle dispersion (first dispersion).

The titanium oxide nanoparticle dispersion (first dispersion) is centrifuged, and the separated nanoparticles washed repeatedly, at least twice (e.g., 2 to 3 times) with butanol, acetone, and hexane, and redispersed to remove an excessive amount of the organic material and obtain a final precipitate. The final precipitate is dispersed in ethanol to obtain titanium oxide nanoparticle dispersion at a concentration of 2 wt % (second dispersion). The amount of the organic material in a nanoparticle dispersion may be evaluated by measuring a reduction in the weight of a device, after heating a device to 600° C. at a rate of 10° C./min with a thermogravimetric analyzer (Q5000, TA Instruments) in a thermal gravimetric analysis (TGA) method.

In the titanium oxide nanoparticle dispersion (second dispersion), a distribution of particle diameters of the titanium oxide nanoparticles are within about 8 nm or less. The particle diameter of the titanium oxide nanoparticles is measured by using a UT F30 Tecnai electron microscope.

Additional ethanol is added to the second dispersion (about three times by volume of to a volume of the titanium oxide nanoparticle dispersion (second dispersion) to obtain a final titanium oxide nanoparticle dispersion at a concentration of 0.5 wt %.

Comparative Synthesis Example 1

Titanium oxide nanoparticle dispersion is obtained according to the same method as Synthesis Example 4 except that an excessive amount of an organic material is not removed from the titanium oxide nanoparticle dispersion (first dispersion).

Synthesis Example 5

The tin oxide $SnO_2$ nanoparticles (PlasmaChem) are dispersed in water at a concentration of 20 wt % to prepare tin oxide nanoparticle dispersion (first dispersion). Subsequently, the tin oxide nanoparticle dispersion (first dispersion) is centrifuged and the separated particles are repeatedly washed with butanol, acetone, and hexane at least twice (2 to 3 times), and redispersed to remove an excessive amount of an organic material and obtain final precipitate The final precipitate is dispersed in ethanol to obtain tin oxide nanoparticle dispersion at a concentration of 2 wt % (second dispersion). In the tin oxide nanoparticle dispersion (second dispersion), a distribution of particle diameters of tin oxide nanoparticles are within about 8 nm or less. A particle diameter distribution of the tin oxide nanoparticles is measured by using a UT F30 Tecnai electron microscope. Additional ethanol is added to the second dispersion (about three times by volume of the tin oxide nanoparticle dispersion (second dispersion) to obtain tin oxide nanoparticle dispersion at a concentration of 0.5 wt %.

Comparative Synthesis Example 2

Tin oxide nanoparticle dispersion is obtained according to the same method as Synthesis Example 5 except that an excessive amount of an organic material is not removed from the tin oxide nanoparticle dispersion (first dispersion).

Example I: Manufacture of Electron-Only Devices

To evaluate thin film characteristics and simple electrical characteristics, an electron-only device (EOD) is manufactured.

Example A

The $Zn_{0.85}Mg_{0.15}O$ nanoparticle dispersion according to Synthesis Example 3 is spin-coated on a glass substrate deposited with ITO (an anode), and heat-treated at 80° C. for 30 minutes to form a 15 nm-thick electron transport layer. Subsequently, a titanium oxide ($TiO_2$) nanoparticle dispersion prepared by purifying an organic material according to Synthesis Example 4 is spin-coated on the electron transport layer, and heat-treated at 80° C. for 30 minutes to form a 5 nm-thick electron injection layer. Then, aluminum (Al, a cathode) is vacuum-deposited on the electron injection layer to be 90 nm thick, to provide an electron-only device.

Comparative Example A-1

An electron-only device is manufactured according to the same method as Example A except that the electron injection layer is not formed on the electron transport layer.

Comparative Example A-2

An electron-only device is manufactured according to the same method as Example A except that the titanium oxide nanoparticle dispersion prepared according to Comparative Synthesis Example 1 instead of the titanium oxide nanoparticle dispersion of Synthesis Example 4 is used to form the electron injection layer.

Example B

An electron-only device is manufactured according to the same method as Example A except that the tin oxide $SnO_2$ nanoparticle dispersion according to Synthesis Example 5 is used instead of the titanium oxide $TiO_2$ nanoparticle dispersion according to Synthesis Example 4.

Comparative Example B-1

An electron-only device is manufactured according to the same method as Example B except that the electron injection layer is not formed on the electron transport layer.

Comparative Example B-2

An electron-only device is manufactured according to the same method as Example B except that the $SnO_2$ nanoparticle dispersion according to Comparative Synthesis Example 2 instead of the $SnO_2$ dispersion of Synthesis Example 5 is used to form the electron injection layer.

Evaluation I

In the electron-only devices according to Examples, the surface morphology of the electron injection layers is examined. The surface morphology is evaluated by using a transmission electron microscope (TEM).

Figure 2:
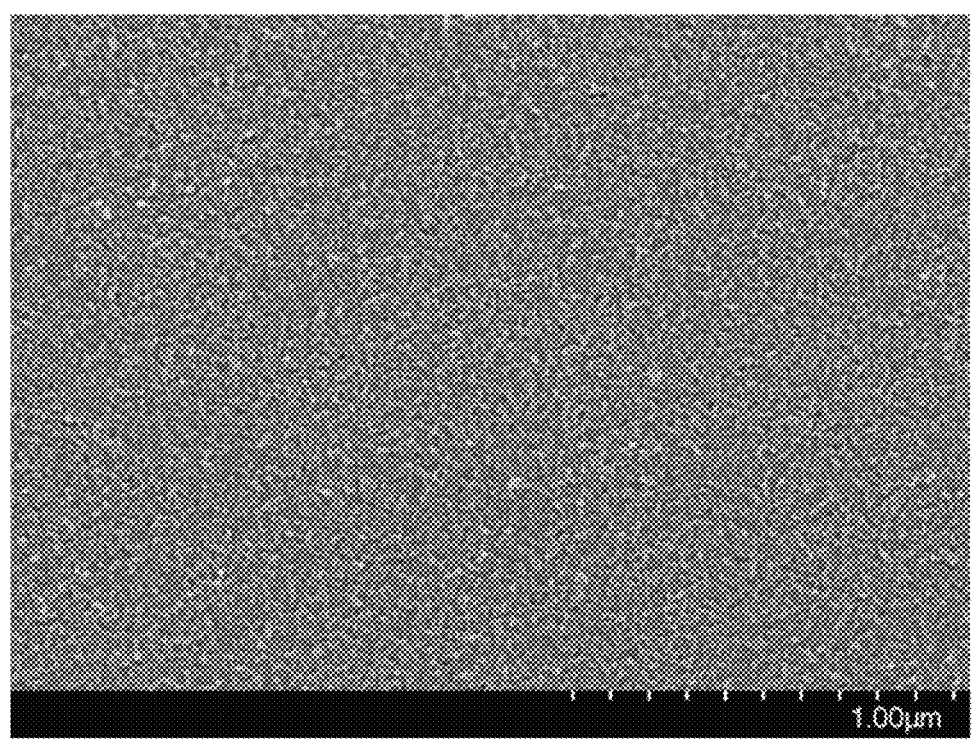
FIG. 2 is a transmission electron microscopic (TEM) photograph of an electron injection layer in the electron only device (EOD) device according to Example A.

FIG. 2 is a transmission electron microscopic (TEM) photograph of an electron injection layer in the electron-only device according to Example A. Referring to FIG. 2, the electron injection layer from the titanium oxide $TiO_2$ nanoparticle dispersion obtained by purifying an organic material according to Synthesis Example 4 appears as a uniform thin film with little, if any, aggregation of the titanium oxide nanoparticles.

Evaluation II

In the electron-only devices according to Examples and Comparative Examples, an amount of an organic material in the electron transport layers and the electron injection layers is examined. The amount of the organic material is evaluated by measuring a reduced weight, after heat the respective devices to 600° C. at a rate of 10° C./min with a thermogravimetric analyzer (Q5000, TA Instruments) in a thermal gravimetric analysis (TGA) method. The results are shown in Table 1.

TABLE 1

| | Amount of an organic material (excluding dispersion medium, wt %) | |
|---|---|---|
| | electron transport layer ($Zn_{0.85}Mg_{0.15}O$ nanoparticles) | electron injection layer ($TiO_2$, $SnO_2$ nanoparticles) |
| Example A | 28.60 | 8.39 |
| Comparative Example A-2 | | 26.18 |
| Example B | | 15.73 |
| Comparative Example B-2 | | 27.77 |

Evaluation III

In the electron-only devices according to Examples and Comparative Examples, the amount of carbon in the electron transport layers and the electron injection layers in each of the respective devices are evaluated through an X-ray diffraction (XRD) analysis. The results are shown in Table 2.

TABLE 2

|  | C/Zn |
| --- | --- |
| Example A | 0.98 |
| Comparative Example A-1 | 1.50 |

Referring to Table 2, the XRD data indicates that the amount of the organic material (in terms of amount of carbon present) in the electron transport layer and the electron injection layer in the electron-only device according to Example A is reduced compared to the amount of the organic material in the electron transport layer in the electron-only device according to Comparative Example A-1.

Evaluation IV

Current characteristics of the electron-only devices according to Examples and Comparative Examples are evaluated. The current characteristics of the electron-only devices are evaluated by using a Keithley SMU2635B current source. The results are shown in FIG. 3.

Figure 3:
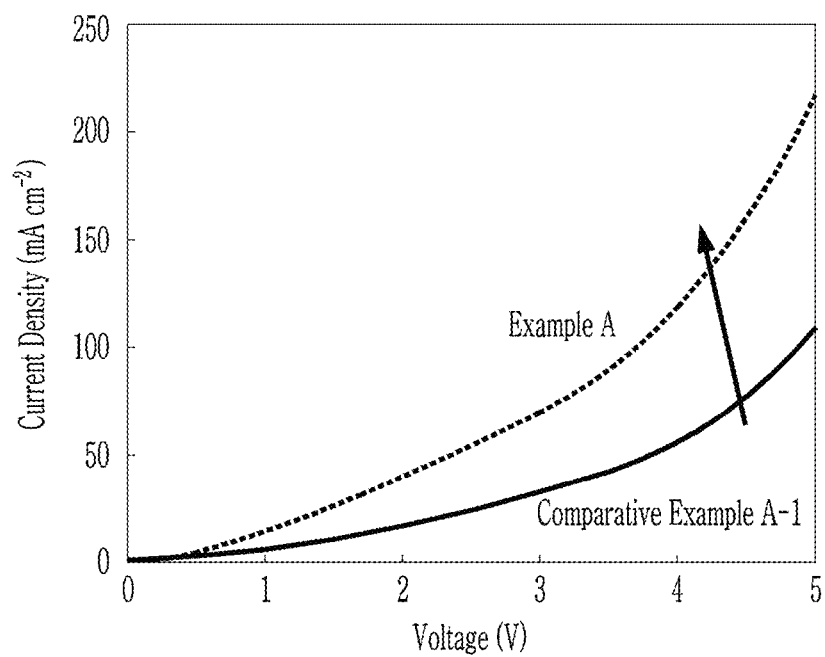
FIG. 3 is a graph showing current characteristics of the EOD devices according to Example A and Comparative Example A-1.

FIG. 3 is a graph showing current characteristics of the electron-only devices according to Example A and Comparative Example A-1. Referring to FIG. 3, the electron-only device according to Example A exhibits significantly improved current characteristics, compared to the electron-only device including no electron injection layer according to Comparative Example A-1.

Example II: Manufacture of Quantum Dot Device

Example 1-1; Blue Quantum Dot Device

A glass substrate deposited with ITO (a work function: 4.8 eV) is surface-treated with UV-ozone for 15 minutes. A PEDOT:PSS solution (H. C. Starks) is spin-coated on the ITO, and then heat-treated under an air atmosphere at 150° C. for 10 minutes, and heat-treated again under a $N_2$ atmosphere at 150° C. for 30 minutes to form a 25 nm-thick lower hole transport layer (HOMO: 5.35 eV, LUMO: 3.0 eV). Subsequently, a poly[(9,9-dioctylfluoren-2,7-diyl-co-(4,4'-(N-4-butylphenyl)diphenylamine] solution (TFB, Sumitomo Corp.) is spin-coated on the lower hole transport layer and then heat-treated at 150° C. for 30 minutes to form a 25 nm-thick upper hole transport layer (HOMO: 5.6 eV, LUMO: 2.69 eV). The ZnTeSe/ZnSeS core shell quantum dot dispersion (a peak emission wavelength: 452 nm to 453 nm) according to Synthesis Example 1 is spin-coated on the upper hole transport layer and then heat-treated at 80° C. for 30 minutes to form a 25 nm-thick quantum dot layer (HOMO: 5.8 eV, LUMO: 3.1 eV). The $Zn_{0.85}Mg_{0.15}O$ nanoparticle dispersion according to Synthesis Example 3 is spin-coated on the quantum dot layer and then heat-treated at 80° C. for 30 minutes to form a 20 nm-thick electron transport layer (HOMO: 7.6 eV, LUMO: 3.9 eV). The titanium oxide nanoparticle dispersion according to Synthesis Example 4 is spin-coated on the electron transport layer and then, heat-treated at 80° C. for 30 minutes to form a 5 nm-thick electron injection layer (HOMO: 7.6 eV, LUMO: 4.1 eV). Subsequently, aluminum (Al) is vacuum-deposited on the electron injection layer to form a 100 nm-thick second electrode (a work function: 4.3 eV), manufacturing a quantum dot device.

Example 1-2

A quantum dot device is manufactured according to the same method as Example 1-1 except that a 3 nm-thick electron injection layer is formed.

Example 1-3

A quantum dot device is manufactured according to the same method as Example 1-1 except that a 6 nm-thick electron injection layer is formed.

Comparative Example 1-1

A quantum dot device is manufactured according to the same method as Example 1-1 except that the electron injection layer is not formed on the electron transport layer.

Comparative Example 1-2

A quantum dot device is manufactured according to the same method as Example 1-1 except that the titanium oxide nanoparticle dispersion according to Comparative Synthesis Example 1 instead of the titanium oxide nanoparticle dispersion according to Synthesis Example 4 is used to form the electron injection layer.

Comparative Example 1-3

A quantum dot device is manufactured according to the same method as Example 1-1 except that the titanium oxide nanoparticle dispersion according to Synthesis Example 4 instead of the $Zn_{0.85}Mg_{0.15}O$ nanoparticle dispersion of Synthesis Example 3 is used to form the electron transport layer, and the $Zn_{0.85}Mg_{0.15}O$ nanoparticle dispersion according to Synthesis Example 3 instead of the titanium oxide nanoparticle dispersion of Synthesis Example 4 is used to form the electron injection layer.

Example 2; Red Quantum Dot Device

A quantum dot device is manufactured according to the same method as Example 1-1 except that the InP core/ZnSe shell/ZnS shell quantum dot dispersion (a peak emission wavelength: 629 nm to 630 nm) according to Synthesis Example 2 instead of the ZnTeSe/ZnSeS core shell quantum dot dispersion according to Synthesis Example 1 is used to form a quantum dot layer (HOMO: 5.55 eV, LUMO: 3.6 eV).

Comparative Example 2-1

A quantum dot device is manufactured according to the same method as Example 2 except that the electron injection layer is not formed on the electron transport layer.

Comparative Example 2-2

A quantum dot device is manufactured according to the same method as Example 2 except that the titanium oxide nanoparticle dispersion according to Comparative Synthesis Example 1 instead of the titanium oxide nanoparticle dispersion of Synthesis Example 4 is used to form the electron injection layer.

Comparative Example 2-3

A quantum dot device is manufactured according to the same method as Example 2 except that the titanium oxide nanoparticle dispersion according to Synthesis Example 4 instead of the $Zn_{0.85}Mg_{0.15}O$ nanoparticle dispersion of Synthesis Example 3 is used to form the electron transport layer, and the $Zn_{0.85}Mg_{0.15}O$ nanoparticle dispersion according to Synthesis Example 3 instead of the titanium oxide nanoparticle dispersion of Synthesis Example 4 is used to form the electron injection layer.

Example 3

A quantum dot device is manufactured according to the same method as Example 2 except that a poly(N,N'-bis-4-butylphenyl-N,N'-bisphenyl)benzidine instead of TFB is used to form the upper hole transport layer and the tin oxide nanoparticle dispersion of Synthesis Example 5 instead of the titanium oxide nanoparticle dispersion of Synthesis Example 4 is used to form the electron injection layer (HOMO: 7.6 eV, LUMO: 4.1 eV).

Comparative Example 3-1

A quantum dot device is manufactured according to the same method as Example 3 except that the electron injection layer is not formed on the electron transport layer.

Comparative Example 3-2

A quantum dot device is manufactured according to the same method as Example 3 except that the tin oxide nanoparticle dispersion according to Comparative Synthesis Example 2 instead of the tin oxide nanoparticle dispersion of Synthesis Example 5 is used to form the electron injection layer.

Comparative Example 3-3

A quantum dot device is manufactured according to the same method as Example 3 except that the tin oxide nanoparticle dispersion according to Synthesis Example 5 instead of the $Zn_{0.85}Mg_{0.15}O$ nanoparticle dispersion of Synthesis Example 3 is used to form the electron transport layer, and the $Zn_{0.85}Mg_{0.15}O$ nanoparticle dispersion according to Synthesis Example 3 instead of the tin oxide nanoparticle dispersion of Synthesis Example 5 is used to form the electron injection layer.

Evaluation V

Current-voltage-luminescence characteristics of the quantum dot devices according to Examples and Comparative examples are evaluated. The current-voltage-luminescence characteristics are evaluated by using a Keithley SMU2635B current source and a Minolta CS-2000A spectroradiometer. Driving voltages thereof are evaluated by using a voltage (a turn-on voltage) for mA current driving.

Life-span characteristics thereof are evaluated by using a reduction in luminance from initial luminance as current meeting a condition that a quantum dot device shows luminance of 650 nit (blue quantum dot device), or 4500 nit (red quantum dot device), is applied to the device, and $T_{95}$ is time it takes to reach 95% of luminance relative to the initial luminance. The results are shown in Tables 3 to 5.

TABLE 3

|  | $\lambda_{max}$ (nm) | $Lum_{max}$ (Cd/m$^2$) | V @ 5 mA | $T_{95}$ (h) |
| --- | --- | --- | --- | --- |
| Example 1-1 | 452 | 33350 | 2.7 | 12.39 |
| Example 1-2 | 452 | 35530 | 3.0 | 11.51 |
| Example 1-3 | 452 | 35780 | 2.9 | 12.20 |
| Comparative Example 1-1 | 452 | 33170 | 3.5 | 0.19 |
| Comparative Example 1-2 | 452 | 19230 | 3.0 | 0.43 |
| Comparative Example 1-3 | 452 | 19620 | 3.0 | 0.19 |

TABLE 4

|  | $\lambda_{max}$ (nm) | $Lum_{max}$ (Cd/m$^2$) | V @ 5 mA | $T_{95}$ (h) |
| --- | --- | --- | --- | --- |
| Example 2 | 630 | 114740 | 2.3 | 73.91 |
| Comparative Example 2-1 | 629 | 90490 | 2.8 | 9.81 |
| Comparative Example 2-2 | 629 | 52800 | 2.7 | 3.52 |
| Comparative Example 2-3 | 629 | 52640 | 2.6 | 2.92 |

TABLE 5

|  | $\lambda_{max}$ (nm) | $Lum_{max}$ (Cd/m$^2$) | V @ 5 mA | $T_{95}$ (h) |
| --- | --- | --- | --- | --- |
| Example 3 | 630 | 79660 | 2.4 | 29.08 |
| Comparative Example 3-1 | 630 | 47060 | 2.9 | 8.06 |
| Comparative Example 3-2 | 630 | 90740 | 2.5 | 9.40 |
| Comparative Example 3-3 | 630 | 51060 | 2.8 | 5.67 |

* $\lambda_{max}$: peak emission wavelength
* $Lum_{max}$: maximum luminance
* V@5 mA: Voltage for driving at 5 mA current (turn-on voltage)
* $T_{95}$(h): The time when the luminance of 95% appears relative to the initial luminance.

Referring to Tables 3 to 5, the quantum dot devices according to Examples 1, 2 and 3, simultaneously exhibit a low driving voltage, improved luminescence characteristics, and high life-span characteristics, compared with the quantum dot devices according to the Comparative Examples.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot device, comprising
    a first electrode and a second electrode each having a surface opposite the other,
    a quantum dot layer between the first electrode and the second electrode,
    an electron transport layer between the quantum dot layer and the second electrode, the electron transport layer comprising first inorganic nanoparticles and a first organic material disposed on a surface of or between adjacent first inorganic nanoparticles,
    wherein the first inorganic nanoparticles are metal oxide nanoparticles represented by $Zn_{1-x}Q_xO$, wherein Q is at least one metal excluding Zn, and $0 \leq x \leq 0.5$, and
    an electron injection layer between the electron transport layer and the second electrode, the electron injection layer comprising second inorganic nanoparticles and a second organic material disposed on a surface of or between adjacent second inorganic nanoparticles,
wherein the second inorganic nanoparticles are different from the first inorganic nanoparticles,
wherein a ratio by weight of an amount of the second organic material to a total amount of the second inorganic nanoparticles and the second organic material in the electron injection layer is less than a ratio by weight of an amount of the first organic material to a total amount of the first inorganic nanoparticles and the first organic material in the electron transport layer.

2. The quantum dot device of claim 1, wherein the ratio by weight of the amount of the second organic material to the total amount of the second inorganic nanoparticles and the second organic material in the electron injection layer is about 0.01 times to about 0.8 times of the ratio by weight of the amount of the first organic material to a total amount of the first inorganic nanoparticles and the first organic material in the electron transport layer.

3. The quantum dot device of claim 1, wherein an amount of the second organic material in the electron injection layer is about 1 weight percent to about 25 weight percent, based on a total amount of the second inorganic nanoparticles and the second organic material.

4. The quantum dot device of claim 1, wherein a LUMO energy level of the electron injection layer is shallower than a work function of the second electrode and deeper than a LUMO energy level of the electron transport layer.

5. The quantum dot device of claim 1, wherein the first inorganic nanoparticles are metal oxide nanoparticles represented by $Zn_{1-x}Q_xO$, wherein Q is at least one metal excluding Zn, and $0 \leq x < 0.5$, and the first organic material is present in an amount of about 20 wt % to about 70 wt % based on the total amount of the first inorganic nanoparticles and the first organic material in the electron transport layer.

6. The quantum dot device of claim 5, wherein the at least one metal Q is Mg, Co, Ni, Ga, Al, Ca, Zr, W, Li, Ti, Ta, Sn, Hf, Si, Ba, or a combination thereof.

7. The quantum dot device of claim 1, wherein the second inorganic nanoparticles are metal oxide nanoparticles that are dispersible in water, alcohol, or a combination thereof.

8. The quantum dot device of claim 1, wherein the second inorganic nanoparticles are metal oxide nanoparticles comprising at least one metal selected from the group consisting of Ti, Ce, Sn, Mg, Zr, W, and Al.

9. The quantum dot device of claim 1, wherein
the second inorganic nanoparticles comprising at least one metal selected from the group consisting of Ti, Ce, Sn, Mg, Zr, W, and Al.

10. The quantum dot device of claim 1, wherein a thickness of the electron injection layer is less than a thickness of the electron transport layer.

11. The quantum dot device of claim 1, wherein a thickness of the electron injection layer is less than or equal to about 10 nanometers.

12. The quantum dot device of claim 1, wherein the electron injection layer is in contact with the second electrode.

13. A quantum dot device, comprising
a first electrode and a second electrode each having a surface opposite the other,
a quantum dot layer between the first electrode and the second electrode,
an electron injection layer between the second electrode and the quantum dot layer, the electron injection layer comprising inorganic nanoparticles and an organic material disposed on a surface of or between adjacent inorganic nanoparticles, and
an electron transport layer between the quantum dot layer and the electron injection layer, the electron transport layer comprises an organic material and metal oxide nanoparticles represented by $Zn_{1-x}Q_xO$, wherein Q is at least one metal excluding Zn, and $0 \leq x < 0.5$,
wherein the inorganic nanoparticles of the electron injection layer are different from the metal oxide nanoparticles of the electron layer,
wherein an amount of the organic material in the electron injection layer is from about 1 weight percent to about 25 weight percent, based on a total amount of the inorganic nanoparticles and the organic material, and
wherein the amount of the organic material in the electron transport layer is present in about 30 wt % to about 70 wt %, based on the total amount of the metal oxide nanoparticles and the organic material in the electron transport layer.

14. The quantum dot device of claim 12, wherein the second inorganic nanoparticles in the electron injection layer are metal oxide nanoparticles comprising at least one metal selected from the group consisting of Ti Ce, Sn, Mg, Zr, W, and Al.

15. The quantum dot device of claim 13, wherein the inorganic nanoparticles in the electron injection layer are metal oxide nanoparticles comprising at least one metal selected from the group consisting of Ti Ce, Sn, Mg, Zr W, and Al.

16. The quantum dot device of claim 13, wherein a thickness of the electron injection layer is less than or equal to about 10 nm.

17. The quantum dot device of claim 13, wherein the electron injection layer is in contact with the second electrode.

18. A method of manufacturing a quantum dot device, comprising forming a first electrode,
forming a quantum dot layer on the first electrode,
forming an electron transport layer on the quantum dot layer, the electron transport layer comprising first inorganic nanoparticles, wherein the first inorganic nanoparticles are metal oxide nanoparticles represented by $Zn_{1-x}Q_xO$, wherein Q is at least one metal excluding Zn, and $0 \leq x < 0.5$,
forming an electron injection layer on the electron transport layer, the electron injection layer comprising second inorganic nanoparticles, wherein the second inorganic nanoparticles are different from the first inorganic nanoparticles, and
forming a second electrode on the electron injection layer,
wherein the forming of the electron injection layer comprises
preparing a first dispersion comprising the second inorganic nanoparticles and an amount of an organic material,
removing at least a portion of the organic material from the first dispersion to prepare a second dispersion including the second inorganic nanoparticles and a remaining portion of the organic material disposed on a surface of or between adjacent second inorganic nanoparticles, wherein an amount of the organic material in the second dispersion is less than the amount of the organic material in the first dispersion, and
coating the second dispersion on the electron transport layer.

19. The method of claim 18, further comprising providing a polar dispersion medium to the second dispersion before the coating of the second dispersion, the polar dispersion medium being water, at least one alcohol, or a combination thereof.

20. The method of claim 18, wherein the amount of the organic material (excluding the dispersion medium) in the second dispersion is from about 1 weight percent to about 22 weight percent, based on a total amount of the second inorganic nanoparticles and the organic material.

21. An electronic device comprising the quantum dot device of claim 1.

22. An electronic device comprising the quantum dot device of claim 13.

23. The quantum dot device of claim 1, wherein an amount of the second organic material in the electron injection layer is about 1 weight percent to 20 weight percent, based on a total amount of the second inorganic nanoparticles and the second organic material, and
- an amount of the first organic material in the electron transport layer is present in about 30 wt % to about 70 wt %, based on the total amount of the first inorganic nanoparticles and the first organic material in the electron transport layer.

* * * * *